(12) United States Patent
Baxter

(10) Patent No.: US 7,650,248 B1
(45) Date of Patent: Jan. 19, 2010

(54) INTEGRATED CIRCUIT FOR IN-SYSTEM SIGNAL MONITORING

(75) Inventor: Michael A. Baxter, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 295 days.

(21) Appl. No.: 11/351,581

(22) Filed: Feb. 10, 2006

(51) Int. Cl.
*G01R 23/00* (2006.01)
*G01R 23/14* (2006.01)
*H03M 1/60* (2006.01)

(52) U.S. Cl. ............... 702/66; 702/75; 324/76.41; 341/157; 341/182

(58) Field of Classification Search ............ 702/66, 702/75; 324/76.41; 341/157, 182
See application file for complete search history.

(56) References Cited

U.S. PATENT DOCUMENTS

| | | | |
|---|---|---|---|
| 4,634,998 A * | 1/1987 | Crawford | 331/1 A |
| 4,659,945 A | 4/1987 | Metz | |
| 5,014,018 A * | 5/1991 | Rodwell et al. | 333/20 |
| 5,121,067 A * | 6/1992 | Marsland | 324/637 |
| 5,122,800 A | 6/1992 | Philipp | |
| 6,247,147 B1 | 6/2001 | Beenstra et al. | |
| 6,297,760 B1 | 10/2001 | Hungerbuehler et al. | |
| 6,397,048 B1 | 5/2002 | Toda | |
| 6,887,339 B1 * | 5/2005 | Goodman et al. | 156/345.28 |
| 7,138,820 B2 | 11/2006 | Goetting et al. | |
| 7,242,217 B2 | 7/2007 | van Wageningen et al. | |
| 7,245,638 B2 | 7/2007 | Agazzi et al. | |
| 7,348,914 B1 | 3/2008 | Hazanchuk et al. | |
| 7,382,304 B2 | 6/2008 | Stein | |
| 2003/0061010 A1 | 3/2003 | Durston | |
| 2007/0200550 A1 | 8/2007 | Corredoura | |

OTHER PUBLICATIONS

Jim Williams; "Measuring Precision-Amplifier Settling Time"; Electronic Design News; Oct. 28, 1999; www.ednmag.com; pp: 85-94.
Xilinx, Inc.; U.S. Appl. No. 11/352,033 by Michael A. Baxter filed on Feb. 10, 2006.
Xilinx, Inc.; *Virtex-4 FPGA Handbook*; published Aug. 2004; available from Xilinx, Inc., 2100 Logic Drive, San Jose, California 95124; pp. 419-460.

* cited by examiner

*Primary Examiner*—Eliseo Ramos Feliciano
*Assistant Examiner*—Janet L Suglo
(74) *Attorney, Agent, or Firm*—W. Eric Webostad; Michael R. Hardaway; Thomas George

(57) ABSTRACT

In-system signal monitoring using an integrated circuit such as a programmable logic device is described. An analog-to-digital converter is disposed in the programmable logic device. A sampling bridge is coupled to provide an analog input to the analog-to-digital converter and to receive first signaling of a first frequency. A signal generator is configured to provide second signaling at a second frequency which is a fraction of the first frequency. Sample window circuitry is coupled to receive the second signaling and configured to provide third signaling to the sampling bridge at least partially responsive to the second signaling and at least partially responsive to an adjustable impedance setting of the sample window circuitry. The sample window circuitry is configured to provide an adjustable sample window within a pulse-width range.

13 Claims, 8 Drawing Sheets

INTEGRATED CIRCUIT FOR IN-SYSTEM SIGNAL MONITORING

FIELD OF THE INVENTION

One or more aspects of the invention relate generally to integrated circuits and systems therefor. More particularly, one or more aspects of the invention relate to an Integrated circuit for in-system signal monitoring.

BACKGROUND OF THE INVENTION

Programmable logic devices ("PLDs") are a well-known type of integrated circuit (IC) that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

One such FPGA is the Xilinx Virtex® FPGA (including Virtex, Virtex 2 and Virtex 4) available from Xilinx, Inc., 2100 Logic Drive, San Jose, Calif. 95124. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

It should be understood that flip-chip and ball grid array packaging generally do not have exposed leads for probing. Thus, to do real-time debug and verification of a design instantiated in an FPGA, a tool called ChipScope from Xilinx, Inc., may be used. ChipScope facilitates debug and verification at or near operating system speed. Essentially, logic analyzer, bus analyzer, and virtual input/output low-profile software cores are loaded into programmable logic of an FPGA in addition to the instantiated design. These cores allow viewing of internal signals and nodes as brought out through a programming interface, and such signals may be captured for output at or near operating system speed. The FPGA may be linked to test bench equipment for signal viewing and analysis.

However, it should be appreciated that a software core solution, such as the ChipScope solution, is for testing while coupled to a "test bench" or other test equipment. Accordingly, it would be desirable and useful to provide means for testing or monitoring a design instantiated in a PLD while in an in-system operating environment.

SUMMARY OF THE INVENTION

One or more aspects of the invention generally relate to integrated circuits and systems therefor. More particularly, one or more aspects of the invention relate to a programmable logic device for in-system signal monitoring.

An aspect of the invention is a system for in-system monitoring of signals. An analog-to-digital converter is disposed in an IC having programmable logic and programmable interconnect. In one instance this IC may be a programmable logic device. A sampling bridge is coupled to provide an analog input to the analog-to-digital converter and coupled to receive first signaling of a first frequency. A signal generator is configured to provide second signaling at a second frequency, the second frequency being a fraction of the first frequency. Sample window circuitry is coupled to receive the second signaling and configured to provide third signaling to the sampling bridge at least partially responsive to the second signaling and at least partially responsive to an adjustable impedance setting of the sample window circuitry. The sample window circuitry is configured to provide an adjustable sample window within a pulse-width range.

Another aspect of the invention is a method for in-system monitoring of signals. A programmable logic device is provided. While operating the programmable logic device, a reference signal having a first frequency is generated within the programmable logic device. The reference signal is converted into a first differential signal which has an adjustable pulse width. A second differential signal having a second frequency is obtained, where the first frequency is a fraction of the second frequency. The second differential signal is sampled responsive to the pulse width of the first differential signal to provide a signal sample as an analog signal. The analog signal is converted to a digital signal in the programmable logic device.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
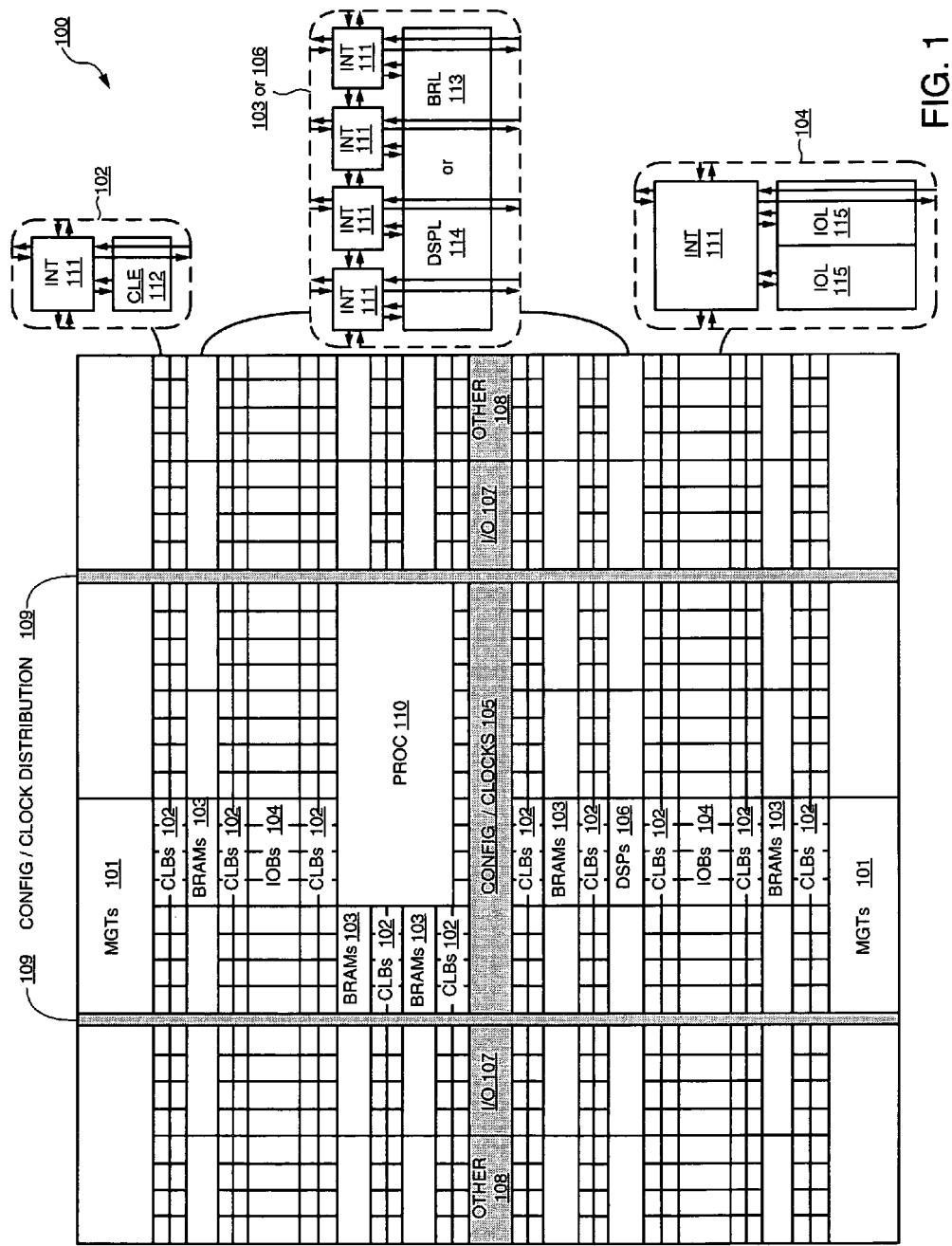
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture. FPGA 100 may be a Virtex-4™ FPGA from Xilinx, Inc. of San Jose, Calif.

Figure 2:
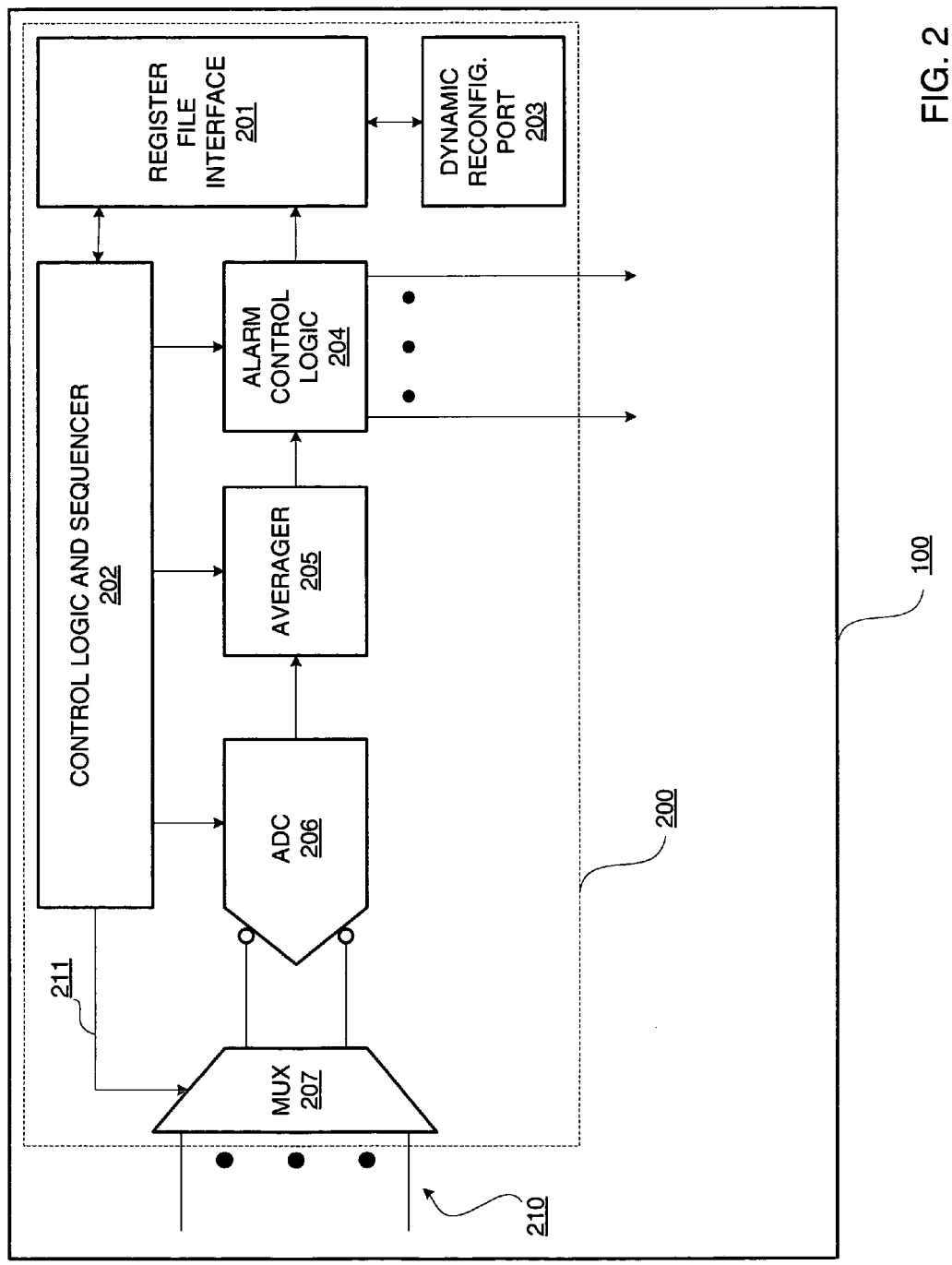
FIG. 2 is a block diagram depicting an exemplary embodiment of a system monitor of the FPGA of FIG. 1.

FIG. 2 is a block diagram depicting an exemplary embodiment of a system monitor 200 of an FPGA 100. System monitor 200 receives one or more analog input signals 210 to a multiplexer 207. Output of multiplexer 207 is selected responsive to a control signal 211 from control logic and sequencer 202. Output from multiplexer 207 is provided to analog-to-digital converter ("ADC") 206. In this particular example, multiplexer 207 is actually a multiplexer tree, and ADC 206 is capable of receiving two analog inputs. Additionally, system monitor 200 may include an averager 205, alarm control logic 204, register file interface 201, and dynamic reconfiguration port 203. Additional details regarding system monitor 200 may be found in the Virtex V4 FPGA Handbook, dated August 2004, at pages 419-460 available from Xilinx, Inc. of San Jose, Calif., which is herein incorporated by reference. Notably, this particular example of an ADC 206 is a 10-bit, 200 kilo-samples-per-second ("kSPs") ADC. In one embodiment this is similar to the ADC in the commercially available Virtex-4 FPGA from Xilinx, Inc. However, it should be appreciated that other known types of ADCs may be implemented in an FPGA. Another embodiment of the system monitor 200 is described in commonly assigned, co-pending U.S. patent application Ser. No. 10/837, 135, filed Apr. 30, 2004, entitled "System Monitor in a Programmable Logic Device", by F. Erich Goetting, et. al., which is herein incorporated by reference. Moreover, as system monitor 200 is known, unnecessary details regarding system monitor 200 are not described for purposes of clarity.

In the following disclosure, real-time sampling of repetitive signals is described. Notably, relatively fast rise time MGT signals are sampled at a lower frequency using a sliding sample window. This sliding sample window is effectively a narrow aperture sampler. This narrow aperture sampler may be used to sample MGT signals at target points of interest. For example, target points of interest may be an MGT receiver and an MGT transmitter. It should be appreciated that sampling may be done synchronously, asynchronously or randomly.

Thus, the following description involves in-situ or in-system signal monitoring using an FPGA. The FPGA may be operating at full speed, though full bandwidth output of such FPGA need not be used. Repetitive measurement using a sliding sample window may be used to measure a repetitive signal. For example, a repetitive gigahertz frequency signal may be progressively sampled at hundreds of kilohertz by sliding a sampling window sequentially. Such a sample window may be incrementally moved to capture a trigger recognition point at some moment of time. For purposes of clarity by way of example, a 200 kSPs, 10-bit ADC is used for sampling an 11 gigahertz MGT repetitive signal, though it should be appreciated that other sampling rates, as well as other signaling frequencies, may be used. A sub-harmonic clock, namely a clock having a frequency which is some fraction of the transmission/reception frequency of the MGT, may be used to provide a reference signal sampling frequency. It should be appreciated that it may not be necessary to have a priori knowledge of a trigger pattern, as measurement may be premised solely on timing or timing events.

Figure 3A:
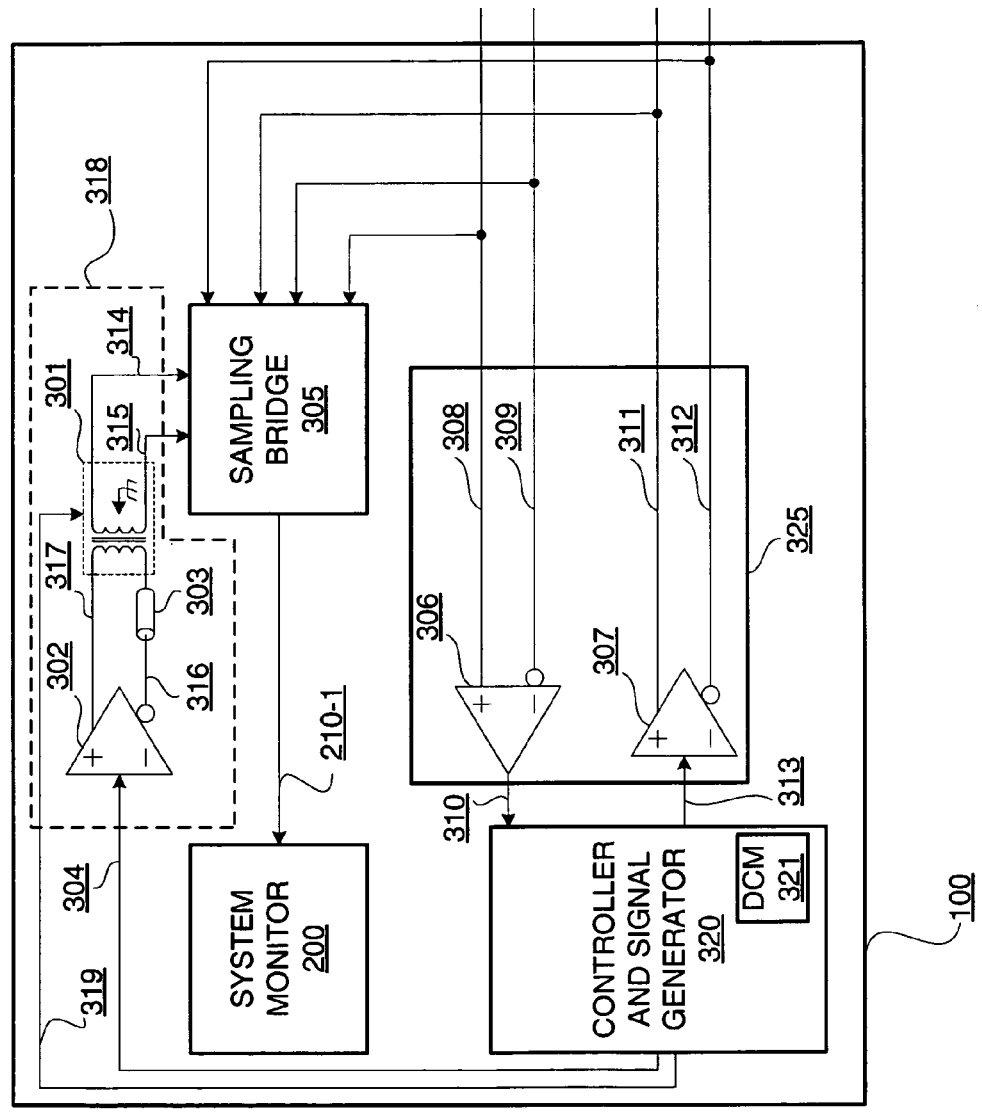
FIG. 3A is a block/schematic diagram depicting an exemplary embodiment of the FPGA of FIG. 1 configured for test signal generation.

FIG. 3A is a block/schematic diagram depicting an exemplary embodiment of an FPGA 100 configured for test signal generation. Controller and signal generator 320 may be configured to provide a reference output signal 313 to differential output buffer 307. Differential output buffer 307 may be a Low Voltage Differential Signaling ("LVDS") output buffer. Reference output signal 313 may be provided as a repetitive signal for purposes of diagnostics and monitoring. Positive and negative outputs 311 and 312 from differential output buffer 307 are provided as inputs to sampling bridge 305.

Controller and signal generator 320 provides sampling reference signal 304. Sampling reference signal 304 may be provided having a fraction of the frequency of reference output signal 313. Thus, for example, a sub-harmonic clock may be used to generate sampling reference signal 304 in a kilohertz range for sampling of reference output signal 313, which is in a gigahertz range. Notably, reference signal 304 need not be gated with a clock signal, but may be asynchronous to a signal being sampled by sampling bridge 305. However, the rate of such sampling responsive to reference signal 304 is limited by the sampling rate of ADC 206 of FIG. 2. Notably, a Digital Clock Manager ("DCM") 321 of an FPGA 100 may be used for signal generation of reference signals described herein, and thus may be considered part of controller and signal generator 320. All or a portion of controller and signal generator 320, aside from DCM 321, may be instantiated in programmable logic.

Sampling reference signal 304 is provided as an input to differential output buffer 302 of sample window circuitry 318. A negative side output 316 of differential output buffer 302 may be provided to an impedance 303 of sample window circuitry 318. Impedance 303 may be used to provide a delay for sampling bridge 305. Positive side output 317 from differential output buffer 302 and negative side output 316 after passing through impedance 303 may be provided to respective terminals of transformer 301 of sample window circuitry 318. These respective terminals coupled to receive differential output from differential output buffer 302 may be considered input terminals of a primary winding of transformer 301. A secondary winding of transformer 301 may be adjustably coupled to ground, and output terminals of such secondary winding of transformer 301 may be used as respective inputs 314 and 315 to sampling bridge 305. Accordingly, it should be appreciated that a secondary winding of transistor 301 is adjusted to provide an impedance sufficient to drive sampling bridge 305. By adjusting impedance of transformer 301 of sample window circuitry 318 such as responsive to a control signal 319 from controller 320, a sample window pulse may be variably generated for sampling bridge 305. This pulse, which may be on the order to 20 to 100 picoseconds wide, may be used to provide a sliding window or narrow aperture for capturing or sampling a high frequency signal, such as a differential signal in a gigahertz range in this example.

For sampling bridge 305 implemented externally to FPGA 100, as illustratively shown in FIG. 3B and described in further detail below, sampling bridge 305 may be implemented with four low-leakage diodes, a small capacitor, and a compensated readout buffer. Alternatively, such as in the embodiment of FIG. 3A, rather than a small capacitor, line input capacitance from inputs 314 and 315 may be used. For sampling bridge 305 internal to FPGA 100, such low leakage diodes may be respectively replaced with fast-switching transistors. It should be appreciated that because 1,500 or less millivolts signaling is used, a relatively simple sampling bridge 305 may be implemented. Sampling bridge 305 is well known and examples are disclosed in "Measuring precision-amplifier settling time", by Jim Williams in the Oct. 28, 1999 Electronic Design News (www.ednmaa.com), U.S. Pat. No. 5,121,067, or U.S. Pat. No. 4,659,945.

Thus, it should be appreciated that differential buffers 306 and 307 may form part of an MGT 325 of an FPGA 100, such as one of MGTs 101 of FIG. 1. Accordingly, output buffer 307 may be a transmitter, and input buffer 306 may be a receiver. Notably, sampling bridge 305 may be part of MGT 325, even though it shown external to MGT 325 in FIG. 3A for purposes of clarity in this example. Furthermore, output buffer 302 and other sample window circuitry 318 used to couple output buffer 302 to sampling bridge 305 may be part of or separate from MGT 325.

It should also be appreciated that FPGA 100, via DCM 321 for example, may be used to provide all of the timing for a diagnostic or monitoring mode. Thus, all phasing, timing, and clock skew, as well as other reference signal parameters, may be controlled by FPGA 100. FPGA 100 may occupy a central hub of coherence for temporal flow of information within a system owing to the ability to controllably generate reference signals.

Sampling of a gigahertz signal using a narrow aperture signal, namely sampling bridge 305, has been described for purposes of sampling output of an MGT transmitter, namely differential output buffer 307. However, another location of interest for sampling may be input to a receiver of MGT 325, namely differential input buffer 306. Thus, sampling bridge 305 may be configured to switch between input pairs, namely to switch between either receiving inputs 311 and 312 as output from differential output buffer 307, or obtaining positive side input 308 and negative side input 309 for differential input buffer 306 as inputs to sampling bridge 305, as those inputs are provided to respective positive and negative terminals of differential input buffer 306. Alternatively, a separate sampling bridge may be used as illustratively shown in FIG. 3C for below-described reasons. Notably, positive side input 308 and negative side input 309 may be provided from one or more other components of a system in which FPGA 100 is located.

Output from sampling bridge 305 may be provided as an external input 210-1 to system monitor 200 or, more particularly, to multiplexer 207 of FIG. 2 of system monitor 200. With continuing reference to FIG. 3A and renewed reference to FIG. 2, FPGA 100 of FIG. 3A is further described.

Output of multiplexer 207 may thus be controllably selected to provide analog signal 210-1 to ADC 206 for conversion to a digital output. Control signal 211 may be responsive to a test period. Thus, it should be understood that sampling bridge 305, by providing a narrow aperture, may be used to sequentially sample a repetitive gigahertz signal. By putting a narrow aperture sampling gate in front of system monitor 200, not only can diagnostics be run at a microchip level, but such diagnostics may be done while operating FPGA 100 in a system environment.

Figure 3B:
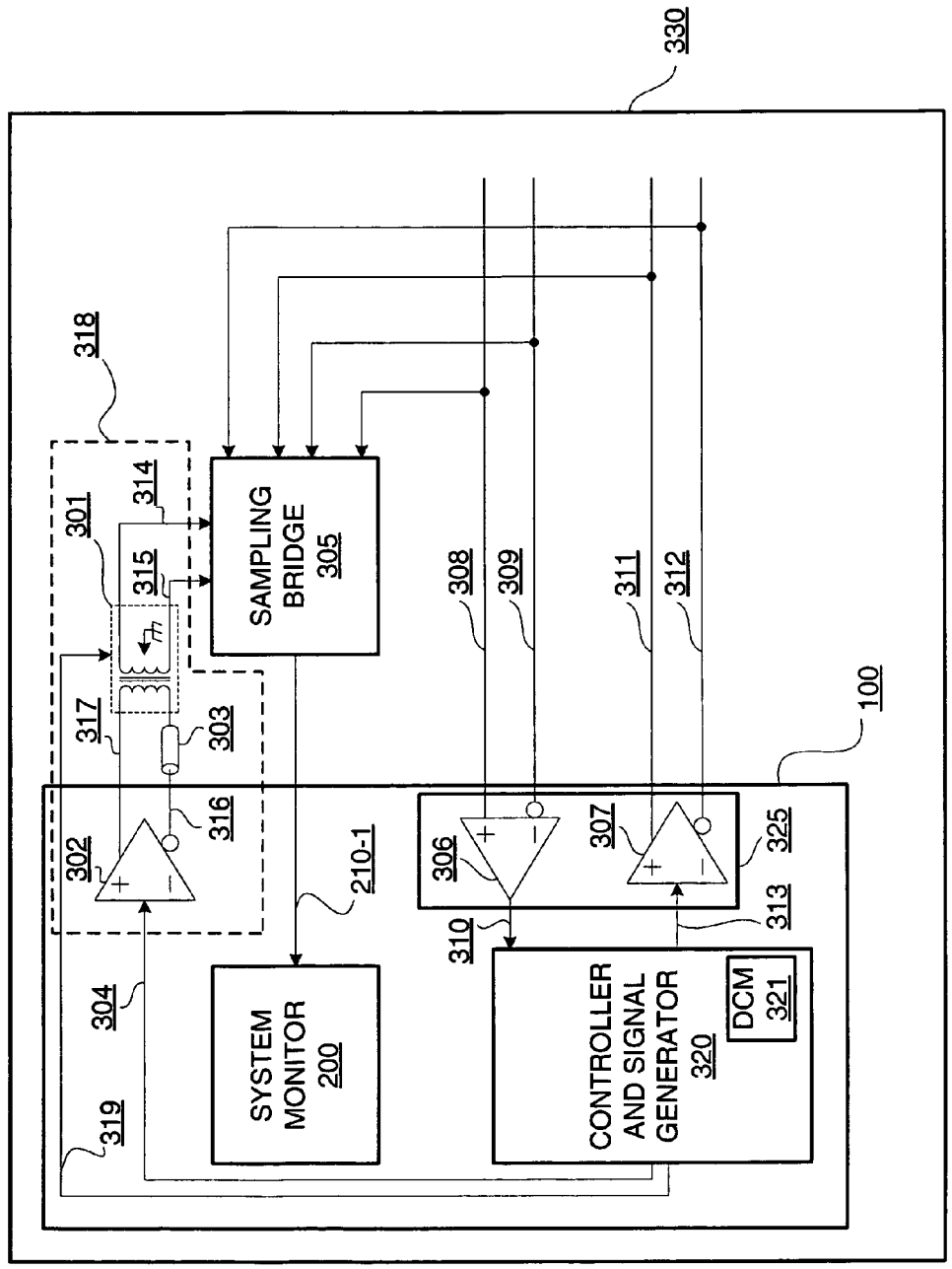
FIG. 3B is a block/schematic diagram depicting an exemplary embodiment of an FPGA implemented on a printed circuit board ("PCB").

FIG. 3B is a block/schematic diagram depicting an exemplary embodiment of an FPGA 300 implemented on a printed circuit board ("PCB") 330. In this implementation, differential buffers 302, 306, and 307 are part of FPGA 300. However, impedance 303, transformer 301, and sampling bridge 305 are implemented externally to FPGA 300, though as part of PCB 330. Thus, it should be understood that other system components may be coupled to PCB 330, where FPGA 300 in addition to generating its own reference signals, is used to provide a reference to other system components for signal coherence within a system.

Figure 3C:
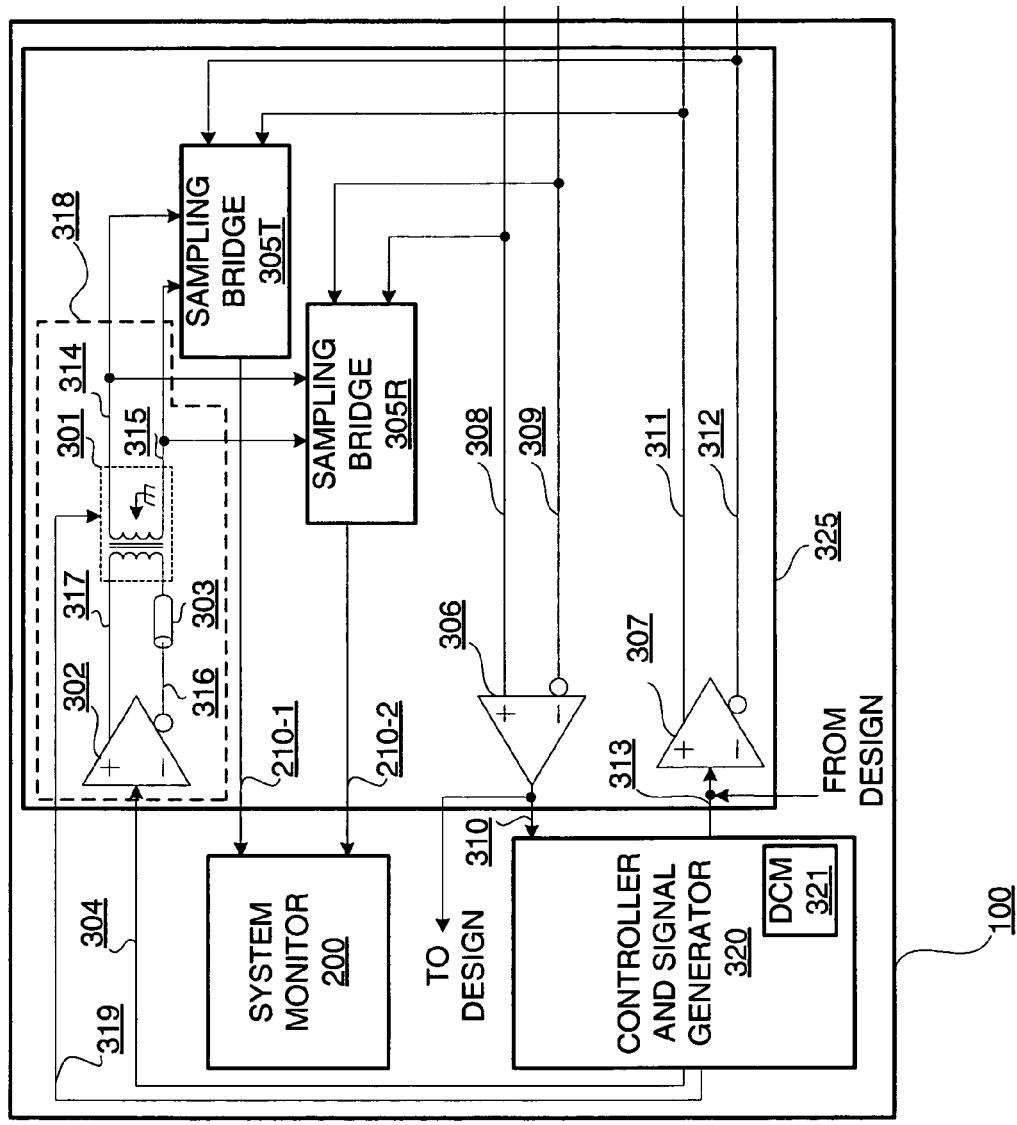
FIG. 3C is a block/schematic diagram depicting the exemplary embodiment of FIG. 3A, though with separate receiver and transmitter sampling bridges.

FIG. 3C is a block/schematic diagram depicting the exemplary embodiment of FIG. 3A, though with separate receiver and transmitter sampling bridges. More particularly, sampling bridge 305-T is coupled to receive output buffer 307 outputs 311 and 312, and sampling bridge 305-R is coupled to receive inputs 308 and 309. Output from sampling bridge 305-T is provided as an analog signal 210-1 as previously described. Analog signal 210-2 output from sampling bridge 305-R is provided as an analog input to system monitor 200. More particularly, analog signal 210-2 is provided to multiplexer 207 of FIG. 2 of system monitor 200, where control logic and sequencer 202 of FIG. 2 is used to select between analog inputs 210-1 and 210-2 using control signal 211. Thus, it should be appreciated that in-system multi-channel diagnostics and monitoring may be done.

In FIG. 3C, MGT 325 is illustratively shown to include sampling bridges 305-R and 305-T, as well as differential output buffer 302, impedance 303, and transformer 301. Notably, transformer 301 may be controlled via control signal 319 from controller and signal generator 320 to adjustably control sliding capture windows for sampling bridges 305-T and 305-R, which may be different depending on which sampling bridge is being used.

It should be appreciated that one channel may be operational while another channel is being tested or monitored. For example, receiver 306 may be operational within a system to provide output 310 to a design instantiated in programmable logic of FPGA 100. Meanwhile, controller and signal generator 320 may be generating reference output signal 313, which is provided to sampling bridge 305-T via output signals 311 and 312. Thus, output of sampling bridge 305-T, which may have a capture window adjustably set via at least in part transformer 301, provides an analog output 210-1 to system monitor 200 for diagnostic testing or monitoring. Notably, the reverse may be done, where while operating differential output buffer 307 with information from an instantiated design in an operating mode, inputs 308 and 309 to FPGA 100 are being sampled by sampling bridge 305-R for a diagnostic or monitoring mode. Furthermore, it should be appreciated that multiple channels may be concurrently operated.

With continuing reference to FIG. 3C, it should be appreciated that by having sampling bridges 305-T and 305-R in close proximity to the receiver and transmitter of MGT 325, a more closely coupled system is provided, which facilitates introduction of more accurate sampling. Furthermore, although a single sampling bridge may be used having a multiplexer to select between receiver and transmitter signals of MGT 325, as mentioned with reference to FIG. 3A, such multiplexing at a gigahertz level of frequency may be problematic. Accordingly, by multiplexing outputs 210-1 and 210-2 using system monitor 200, which outputs are provided at a fraction of the frequency of gigahertz signals 308 through 312, such multiplexing may be less problematic.

Furthermore, the speed of ADC 206 of FIG. 2 may allow, or may be increased to allow, for time domain multiplexing ("TDM") of more than two channels. Furthermore, sampling may take place at locations other than of receiving to and transmitting from an MGT. More generally, any place an interface exists where a user may examine electrical power, electrical noise, or signal integrity, or any combination of one or more of these, sampling may be done.

At this point, it should be appreciated that FPGA 100 may be used to monitor and perform measurement of signal characteristics. This on-chip measurement may be processed by an ADC, such as ADC 206 of FIG. 2, to provide digital data. This digital data may be provided to an external host computer for processing. However, FPGA 100 may be configured to process measured signal data and then provide such processed data to a host computer. FPGA 100 may be coupled to such a host computer during a development stage, but decoupled from such host computer when deployed in a field application. Furthermore, with respect to a design instantiated in an FPGA, or with respect to a system design in which an FPGA is implemented, or any combination thereof, it should be appreciated that triggering events are generally known by the designers, and accordingly a sliding window for measuring a repetitive signal may be directed to be proximate to such triggering events.

Figure 4A:
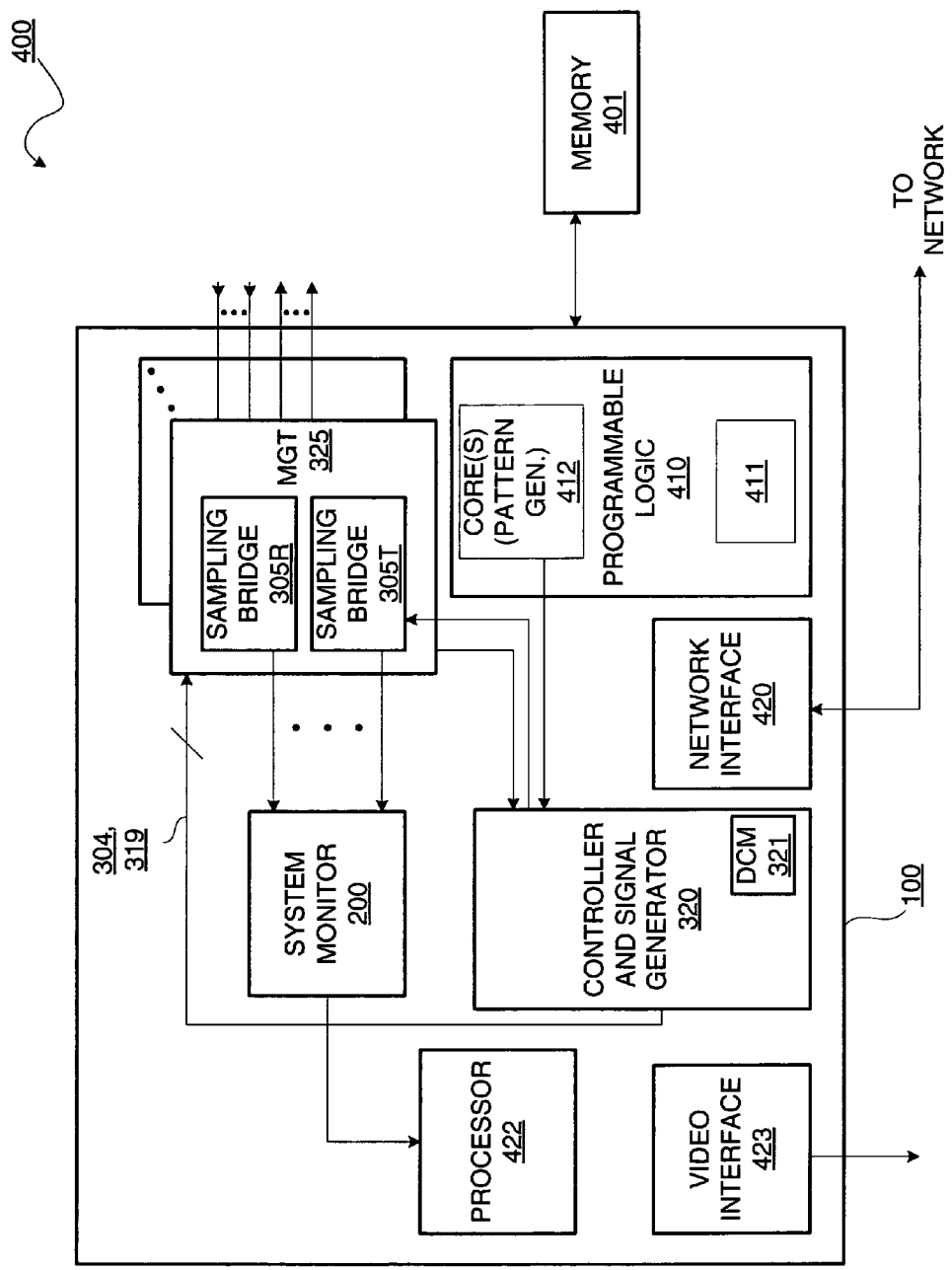
FIG. 4A is a block diagram depicting an exemplary embodiment of an FPGA system that includes a network interface, a video interface, and a processor.

FIG. 4A is a block diagram depicting an exemplary embodiment of a system-on-a-chip ("SoC"), where the "chip" is an IC having programmable logic and programmable interconnect, such as an FPGA, namely FPGA system 400. For purposes of clarity, known connections of blocks in FPGA system 400 are not shown. In FPGA system 400, FPGA 100 includes network interface 420, video interface 423, and processor 422. Notably, processor 422 may be an instantiated processor or an embedded processor, namely a soft processor or a hard processor. Alternatively, processor 422 may be externally coupled to FPGA 100. Notably, a user design 411 may be instantiated in programmable logic 410. Memory 401, external to FPGA 100, may be coupled thereto for configuration of programmable logic 410 of FPGA 100. Alternatively, memory 401 may be internal to FPGA 100. Memory 401 may include one or more of different types of cores for loading into FPGA 100 and instantiation in programmable logic 410 as core(s) 412. Thus, FPGA 100 may be configured for any of a variety of types of signal analysis. Accordingly, as data is provided to or sent from one or more MGTs 325, system monitor 200 may be used to provide a digital snapshot of such data as it is sampled on one or more channels. Sampled data may be used for system monitoring, and may be accumulated, such as in BRAM of FPGA 100, for signal analysis. Sampled data may be provided as an output, such as via a video interface 423 for visual real-time monitoring or to network interface 420 for remote control of FPGA 100.

It should be understood that although FPGA 100 of FIG. 3C is used as an example for FPGA system 400 for purposes of clarity as sampling bridges 305T and 305R are part of MGT 325, other FPGA configurations, as mentioned herein, may be implemented in system 400. Furthermore, it should be understood that depending on which memory core or cores 412 are implemented, signal analysis may be done internally in an FPGA 100 after such FPGA 100 has been put into a system application. For example, self-time domain reflectometry per channel may be used to test multiple channels, as multiplexed, for channel quality of signal after FPGA 100 leaves the manufacturer. Another example may be to configure programmable logic 410 to have a pattern generator as or as part of one or more cores 412. Thus, a test pattern may be provided to controller and signal generator 320 as bound for sampling bridge 305T. Furthermore, because signals may be observed by FPGA 100 while such signals are occurring, FPGA 100 may be used to provide "what you see is what you get while it's going" ("WYSIWYGWIG") data. In other words, signals may be monitored in real-time and such monitoring may be of the actual signal. Furthermore, such data may be processed internally by FPGA 100 to provide high-level reduced data according to a protocol, and such data may be output after on-chip processing to a network via network interface 420. Thus, quality of each channel coupled to FPGA 100 may be monitored remotely. Accordingly, it should be appreciated that FPGA 100 of FIG. 4A may be used for system monitoring of signal quality, as well as processing data associated with such monitoring. It should be further appreciated that such monitoring may be done in-situ in a system application. Furthermore, it should be appreciated that such monitoring may be for more than one channel at a time, namely concurrent monitoring.

Additionally, because an FPGA may be configured to provide self-reference signals, such FPGA may be the source of system temporal coherence. FPGAs implemented in such system applications may provide timing and control information for such systems. Furthermore, it should be appreciated that because FPGA 100 may be used for continuous monitoring within a system, FPGA 100 may be used to identify unstable or uncorrelated events. For example, when FPGA 100 is implemented on a line card, and such line card is plugged into a back plane, though incorrectly, FPGA 100 may be able to determine that such line card is improperly plugged in by monitoring of channels, for example.

Notably, FPGA 100 provides a synchronous-to-asynchronous interface. Again, a repetitive reference signal may be provided; however, sampling may be correlated to any time at which samples may be taken and are not necessarily correlated to a clock. Alternatively, FPGA 100 may be correlated to a clock where control signal 304 of FIG. 3A is gated by a clock. However, it should be appreciated that FPGA 100 is driven by timing events, and thus it is non-trigger-pattern dependent. This is in contrast to systems that are space-dependent, namely they depend on triggering patterns and a priori knowledge of such triggering patterns to use such systems. FPGA 100 is not dependent upon having a priori knowledge of a triggering pattern, as such events may be detected by observation of WYSIWYGWIG data.

Figure 4B:
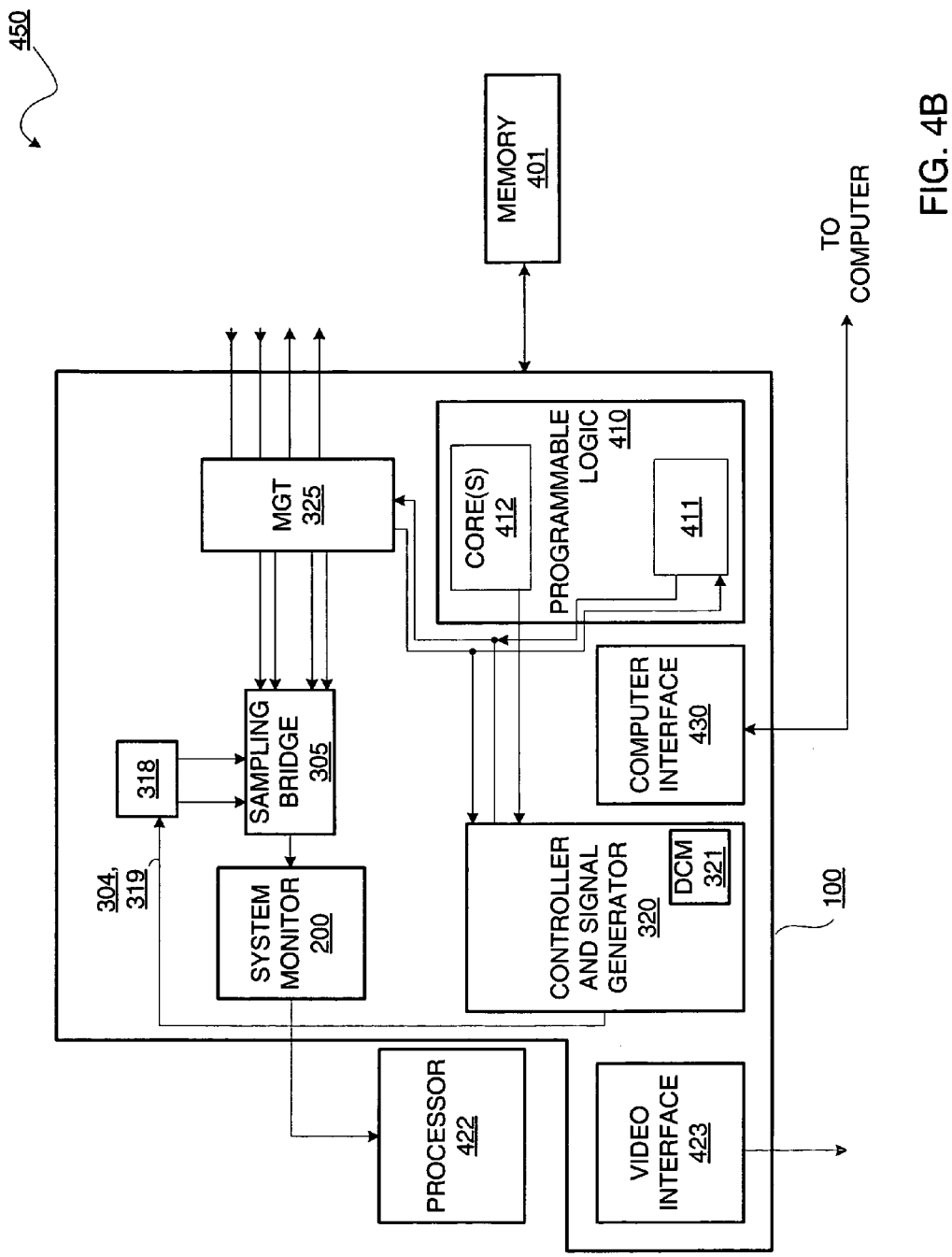
FIG. 4B is a block diagram depicting an exemplary embodiment of an FPGA system similar to that of FIG. 4A, except in part that the network interface of FIG. 4A is replaced with a computer interface for a more direct coupling of an administrative computer for control of signal analysis.

FIG. 4B is a block diagram depicting an exemplary embodiment of an FPGA system 450. FPGA system 450 of FIG. 4B is similar to FPGA system 400 of FIG. 4A, except that network interface 420 of FIG. 4A is replaced with computer interface 430 of FIG. 4B for a more direct coupling with an administrative computer, such as a personal computer or workstation, for control of signal analysis by FPGA 100. Such control may include selecting which cores in memory 401 to load or unload into programmable logic 410. Another difference is that a single MGT 325 and sampling bridge 305 external therefrom as shown in FIG. 3A is illustratively shown implemented in FPGA system 450 for purposes of clarity, as implementation of multiple instances of such circuitry follows from this example. Again, programmable logic 410 may be configured to provide a pattern generator as or as part of one or more cores 412. Thus, a test pattern may be provided to controller and signal generator 320 as bound for sampling bridge 305 via MGT 325. Another difference is that processor 422 is an externally coupled processor to programmable logic device 100.

Figure 5:
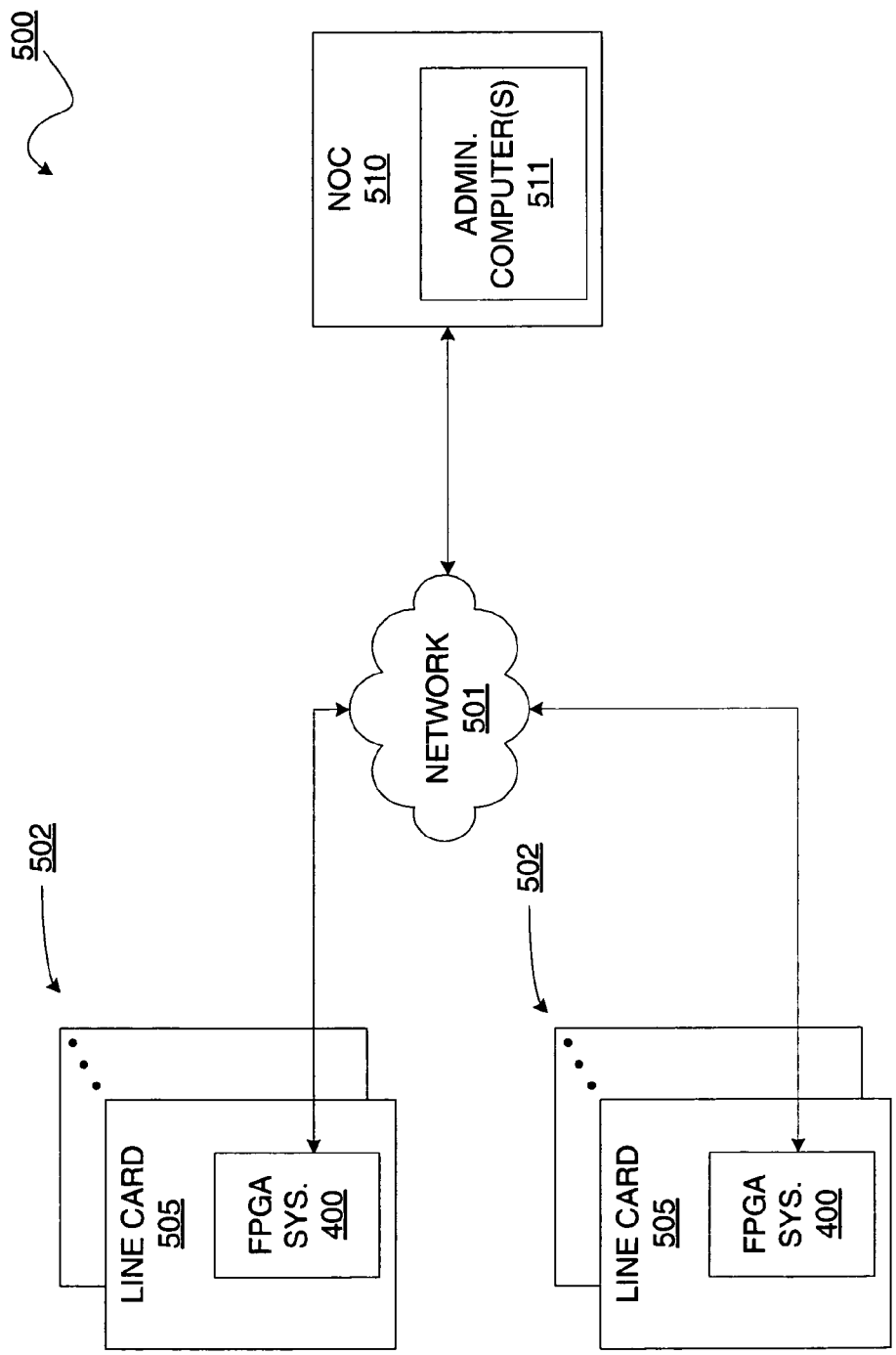
FIG. 5 is a network diagram depicting an exemplary embodiment of a networked system.

FIG. 5 is a network diagram depicting an exemplary embodiment of a networked system 500. Networked system 500 includes groups of one or more line cards generally indicated as groups 502. Each of such line cards may have an FPGA system 400. Each FPGA system 400 may be coupled to a network operation center ("NOC") 510 via network 501. NOC 510 may include one or more administrative computers 511. Accordingly, it should be appreciated that each channel of communications within a network may be monitored remotely using an FPGA system 400. Furthermore, problems in such channels may be remotely diagnosed by loading one or more cores from memory 401 of FIG. 4A into such FPGA systems 400. Thus, it should be appreciated that from a NOC 510, an operator may identify which line card and which channel have a signal problem, and further information regarding characteristics of such problem as determined through signal analysis may be provided. Accordingly, problems in the network may be more readily located and diagnosed by using FPGA systems 400.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. For example, FPGA programmable logic and a processor embedded in the FPGA may in combination be configured to provide application-specific signal processing. For example, FPGA programmable logic may be configured to provide waveform averaging or digital signal processing blocks of the FPGA may be configured to provide windowing, either of these configurations may be combined with an embedded or external processor operating responsive to Fast Fourier Transform software. Notably, rather than using an embedded processor in an FPGA, FPGA programmable logic may be configured to provided a "soft" processor. Claim(s) listing steps do not imply any order of the steps. Trademarks are the property of their respective owners.

What is claimed is:

1. A system for in-system monitoring of signals, comprising:
    an analog-to-digital converter disposed in an integrated circuit (IC);
    a sampling bridge coupled to provide an analog input to the analog-to-digital converter, the sampling bridge coupled to receive first signaling of a first frequency and being internal to the integrated circuit;
    a signal generator configured to provide second signaling at a second frequency, the second frequency being a fraction of the first frequency;
    sample window circuitry coupled to receive the second signaling and configured to provide third signaling to the sampling bridge at least partially responsive to the second signaling and at least partially responsive to an adjustable impedance setting of the sample window circuitry; and
    the sample window circuitry configured to provide an adjustable sample window within a pulse-width range;
    wherein the sampling bridge is located within a multi-gigabit transceiver of the IC, or the IC includes a multi-gigabit transceiver coupled to the sampling bridge.

2. The system according to claim 1, wherein the sample window circuitry is at least partially internal to the IC.

3. The system according to claim 1, wherein the first signaling is a first differential signal pair, and wherein the third signaling is a second differential signal pair.

4. The system according to claim 3, wherein the first signaling is gigahertz differential signaling, and wherein the second signaling is kilohertz differential signaling.

5. The system according to claim 4, wherein the pulse-width range is approximately 20 to 100 picoseconds.

6. The system according to claim 1, wherein a receiver portion of the multi-gigabit transceiver is coupled to receive the first signaling.

7. The system according to claim 1, wherein a transmitter portion of the multi-gigabit transceiver is coupled to provide the first signaling responsive to fourth signaling provided from the signal generator at the first frequency.

8. The system according to claim 7, wherein the first signaling is a first differential signal pair provided responsive to the fourth signaling, wherein the third signaling is a second differential signal pair provided responsive to the second signaling, and wherein the second signaling and the fourth signaling are respective single reference signals generated internal to the IC.

9. The system according to claim 8, wherein the IC includes a microprocessor for signal processing of samples sampled with the adjustable sample window, the microprocessor being one of an embedded microprocessor in the IC, an instantiated microprocessor in a programmable logic of the IC, or an external microprocessor coupled to the IC.

10. A method for in-system monitoring of signals, comprising:

provihting an integrated circuit;

while operating the integrated circuit, generating within the integrated circuit a first reference signal having a first frequency;

converting the first reference signal into a first differential signal, the first differential signal having an adjustable pulse width;

obtaining a second differential signal having a second frequency, the first frequency being a fraction of the second frequency;

sampling the second differential signal responsive to the pulse width of the first differential signal to provide a signal sample as a first analog signal;

converting the first analog signal to a first digital signal in the integrated circuit;

adjusting the pulse width of the first differential signal to obtain another signal sample to provide a second analog signal;

multiplexing the first analog signal and the second analog signal;

selecting the second analog signal for output from the multiplexing; and converting the second analog signal selected to a second digital signal in the integrated circuit;

wherein the first analog signal and the second analog signal are respectively associated with different communication channels.

11. The method according to claim 10, further comprising:

generating within the integrated circuit a second reference signal; and providing the second differential signal responsive to the second reference signal.

12. The method according to claim 10, wherein the second differential signal is gigahertz differential signaling, and wherein the first differential signal is kilohertz differential signaling.

13. The method according to claim 10, wherein the first analog signal is associated with a transmission channel, and wherein the second analog signal is associated with a reception channel.

* * * * *

UNITED STATES PATENT AND TRADEMARK OFFICE
CERTIFICATE OF CORRECTION

PATENT NO.        : 7,650,248 B1                                           Page 1 of 1
APPLICATION NO.  : 11/351581
DATED             : January 19, 2010
INVENTOR(S)       : Michael A. Baxter It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 638 days.

Signed and Sealed this

Twenty-third Day of November, 2010

David J. Kappos
*Director of the United States Patent and Trademark Office*